(12) United States Patent
Hollis (10) Patent No.: US 9,921,993 B2
(45) Date of Patent: Mar. 20, 2018

(54) MEMORY CIRCUIT CONFIGURATION SCHEMES ON MULTI-DROP BUSES

(71) Applicant: QUALCOMM Incorporated, San Diego, CA (US)

(72) Inventor: Timothy Mowry Hollis, Poway, CA (US)

(73) Assignee: QUALCOMM Incorporated, San Diego, CA (US)

( * ) Notice: Subject to any disclaimer, the term of this patent is extended or adjusted under 35 U.S.C. 154(b) by 219 days.

(21) Appl. No.: 14/456,216

(22) Filed: Aug. 11, 2014

(65) Prior Publication Data

US 2016/0041943 A1     Feb. 11, 2016

(51) Int. Cl.
*G06F 13/42*   (2006.01)
*G06F 12/1009*   (2016.01)
(Continued)

(52) U.S. Cl.
CPC ...... *G06F 13/4243* (2013.01); *G06F 12/1009* (2013.01); *G06F 13/1689* (2013.01); *G06F 13/1694* (2013.01); *G11C 7/1084* (2013.01); *G11C 7/1093* (2013.01); *G11C 7/22* (2013.01); *G11C 11/4076* (2013.01);
(Continued)

(58) Field of Classification Search
CPC ............. G06F 13/4243; G06F 13/1689; G06F 13/1694; G06F 12/1009; G11C 7/22; G11C 7/1084; G11C 7/1093; G11C 11/4079; G11C 11/4093; G11C 29/025; G11C 29/028
See application file for complete search history.

(56) References Cited

U.S. PATENT DOCUMENTS 6,807,650 B2   10/2004   Lamb et al.
7,484,064 B2   1/2009   Ware et al.
(Continued)

OTHER PUBLICATIONS

International Search Report and Written Report for International Patent Application No. PCT/US2015/044454, dated Oct. 19, 2015, 11 pages.
(Continued)

*Primary Examiner* — Nimesh G Patel
(74) *Attorney, Agent, or Firm* — Withrow & Terranova, PLLC (57) ABSTRACT

Memory circuit configuration schemes on multi-drop buses are disclosed. In aspects disclosed herein, an on-die mapping logic is provided in a memory circuit. A memory controller communicates with the on-die mapping logic over a multi-drop bus. The on-die mapping logic is configured to receive a predetermined on-die termination (ODT) value from the memory controller prior to being accessed. In response to receiving the predetermined ODT value, the memory circuit sets on-die termination to the predetermined ODT value and instructs an on-die reference signal generator to generate a predetermined reference signal associated with the predetermined ODT value. The predetermined reference signal provides an optimal reference voltage for implementing a desired equalization setting at the memory circuit, thus aiding in preserving signal integrity. Such improved signal integrity reduces errors in accessing the memory circuit, thus leading to improved efficiency and data throughput on the multi-drop bus.

26 Claims, 6 Drawing Sheets

(51) Int. Cl.
*G06F 13/16* (2006.01)
*G11C 7/10* (2006.01)
*G11C 7/22* (2006.01)
*G11C 11/4076* (2006.01)
*G11C 11/4093* (2006.01)
*G11C 29/02* (2006.01)

(52) U.S. Cl.
CPC ........ *G11C 11/4093* (2013.01); *G11C 29/025* (2013.01); *G11C 29/028* (2013.01); *G06F 2212/65* (2013.01); *G11C 2207/2254* (2013.01)

(56) References Cited

U.S. PATENT DOCUMENTS

| | | | |
|---|---|---|---|
| 7,542,305 B2 | 6/2009 | Petersen et al. | |
| 7,710,144 B2 | 5/2010 | Dreps et al. | |
| 7,848,175 B2 | 12/2010 | Fox et al. | |
| 2004/0196280 A1* | 10/2004 | Yee | G09G 5/006 |
| | | | 345/418 |
| 2009/0238012 A1 | 9/2009 | Tatapudi et al. | |
| 2010/0030934 A1 | 2/2010 | Bruennert et al. | |
| 2011/0283060 A1* | 11/2011 | Ware | G06F 13/1636 |
| | | | 711/106 |
| 2014/0184523 A1* | 7/2014 | McCall | H03K 19/0005 |
| | | | 345/173 |
| 2014/0192583 A1* | 7/2014 | Rajan | G11C 7/10 |
| | | | 365/63 |
| 2015/0364177 A1* | 12/2015 | Lee | G11C 7/14 |
| | | | 365/189.07 |
| 2016/0044261 A1* | 2/2016 | Hagihara | H03M 1/12 |
| | | | 348/295 |

OTHER PUBLICATIONS

International Preliminary Report on Patentability for PCT/US2015/044454, dated Dec. 19, 2016, 23 pages.

Second Written Opinion for PCT/US2015/044454, dated Jul. 18, 2016, 7 pages.

Micron Technology, Inc., "TN-41-04: DDR3 Dynamic On-Die Termination," Micron Technical Note, 2008, pp. 1-5.

\* cited by examiner

MEMORY CIRCUIT CONFIGURATION SCHEMES ON MULTI-DROP BUSES

BACKGROUND

I. Field of the Disclosure

The technology of the disclosure relates generally to accessing circuits over a multi-drop bus.

II. Background

Modern electronic devices (e.g., computers, laptops, smartphones, etc.) all require a large amount of on-board memory for application processing and data storage needs. One type of on-board memory is known as a synchronous dynamic random access memory (SDRAM). Advancement of SDRAM technology has led to a class of high-density, high-throughput double data rate (DDR) SDRAM. The latest versions of DDR SDRAM include personal computer (PC) DDR-3, low-power (LP) DDR-3, PCDDR-4, and LPDDR-4. DDR SDRAM integrated circuits (ICs) are often packaged into an integrated memory module commonly referred to as a dual inline memory module (DIMM). Multiple DIMMs are usually needed to provide the large amount of on-board memory required by memory-consuming electronic devices.

By design, a multi-drop memory bus is configured to provide connections to multiple DIMMs. In particular, a memory controller communicates with each of the DIMMs over the memory bus, with a DIMM being associated with each drop on the multi-drop memory bus. Depending on bus topology, electrical characteristics experienced at the target DIMM may vary significantly depending on which DIMM is the target DIMM. That is, impedance changes created by different geometries, reflections associated with stubs on the bus, and other incongruities may all contribute to a bus that has a first signal profile when signaling to a first DIMM and a second signal profile when signaling to a second DIMM.

While the latest versions of DDR SDRAM provide dynamic on-die termination, which allows the memory controller to reconfigure memory terminations independently depending on to which device the memory controller is currently writing, empirical evidence suggests that equalization methods suffer from the requirement for co-optimization for all potential connections, leading to a compromised solution, which is sub-optimal for any particular connection, albeit generally acceptable for all connections.

SUMMARY OF THE DISCLOSURE

Aspects disclosed in the detailed description include memory circuit configuration schemes on multi-drop buses. In aspects disclosed herein, an on-die mapping logic is provided in a memory circuit. A memory controller communicates with the on-die mapping logic over a multi-drop bus. The on-die mapping logic is configured to receive a predetermined on-die termination (ODT) value from the memory controller. The predetermined ODT value will most often come in a multi-bit digital format from the memory controller, either as parallel bits or sequential bits. The predetermined ODT value is provided prior to reading from or writing to memory ranks of the memory circuit. In response to receiving the predetermined ODT value, the memory circuit sets on-die termination to the predetermined ODT value. The on-die mapping logic is further configured to instruct an on-die reference signal generator to generate a predetermined reference signal associated with the predetermined ODT value received from the memory controller. The predetermined reference signal provides an optimal reference voltage for implementing a desired equalization setting at the memory circuit. By dynamically adjusting the on-die termination and the predetermined reference signal, aspects of the present disclosure aid in preserving signal integrity. Such improved signal integrity reduces errors in writing data to the memory or in reading data from the memory circuit, thus leading to improved efficiency and data throughput on the multi-drop bus.

In this regard, in one aspect, a memory circuit is disclosed. The memory circuit comprises an on-die reference signal generator. The memory circuit also comprises an on-die mapping logic. The on-die mapping logic is configured to receive an ODT value on a first communication channel. The on-die mapping logic is also configured to instruct the on-die reference signal generator to produce a predetermined reference signal associated with the ODT value. The memory circuit also comprises a receiver configured to equalize a data signal received on a second communication channel based on the predetermined reference signal.

In another aspect, a memory circuit means is disclosed. The memory circuit means comprises a means for on-die reference signal generation. The memory circuit means also comprises a means for on-die mapping. The means for on-die mapping is configured to receive an ODT value on a first communication channel. The means for on-die mapping is also configured to instruct the means for on-die reference signal generation to produce a predetermined reference signal associated with the ODT value. The memory circuit means also comprises a means for reception configured to equalize a data signal received on a second communication channel based on the predetermined reference signal.

In another aspect, a method for configuring a calibrated memory circuit over a multi-drop bus prior to accessing the calibrated memory circuit is disclosed. The method comprises receiving a predetermined ODT value by an on-die mapping logic in the calibrated memory circuit. The method also comprises retrieving a predetermined reference signal value from a lookup table based on the predetermined ODT value. The method also comprises instructing an on-die reference signal generator to produce a predetermined reference signal based on the predetermined reference signal value.

In another aspect, a multi-drop memory system is disclosed. The multi-drop memory system comprises a multi-drop bus comprising a command bus and a data bus. The multi-drop memory system also comprises a memory controller connecting to the multi-drop bus. The multi-drop memory system also comprises at least one memory circuit connecting to the multi-drop bus. The at least one memory circuit comprises an on-die mapping logic configured to receive a control signal from the memory controller over the command bus and generate an instruction signal. The at least one memory circuit also comprises an on-die reference signal generator configured to receive the instruction signal and generate a predetermined reference signal. The at least one memory circuit also comprises a receiver configured to receive the predetermined reference signal and a data signal received from the memory controller over the data bus.

DETAILED DESCRIPTION

With reference now to the drawing figures, several exemplary aspects of the present disclosure are described. The word "exemplary" is used herein to mean "serving as an example, instance, or illustration." Any aspects described herein as "exemplary" is not necessarily to be construed as preferred or advantageous over other aspects.

Aspects disclosed in the detailed description include memory circuit configuration schemes on multi-drop buses. In aspects disclosed herein, an on-die mapping logic is provided in a memory circuit. A memory controller communicates with the on-die mapping logic over a multi-drop bus. The on-die mapping logic is configured to receive a predetermined on-die termination (ODT) value from the memory controller. The predetermined ODT value will most often come in a multi-bit digital format from the memory controller, either as parallel bits or sequential bits. The predetermined ODT value is provided prior to reading from or writing to memory ranks of the memory circuit. In response to receiving the predetermined ODT value, the memory circuit sets on-die termination to the predetermined ODT value. The on-die mapping logic is further configured to instruct an on-die reference signal generator to generate a predetermined reference signal associated with the predetermined ODT value received from the memory controller. The predetermined reference signal provides an optimal reference voltage for implementing a desired equalization setting at the memory circuit. By dynamically adjusting the on-die termination and the predetermined reference signal, aspects of the present disclosure aid in preserving signal integrity. Such improved signal integrity reduces errors in writing data to the memory or in reading data from the memory circuit, thus leading to improved efficiency and data throughput on the multi-drop bus.

Figure 1:
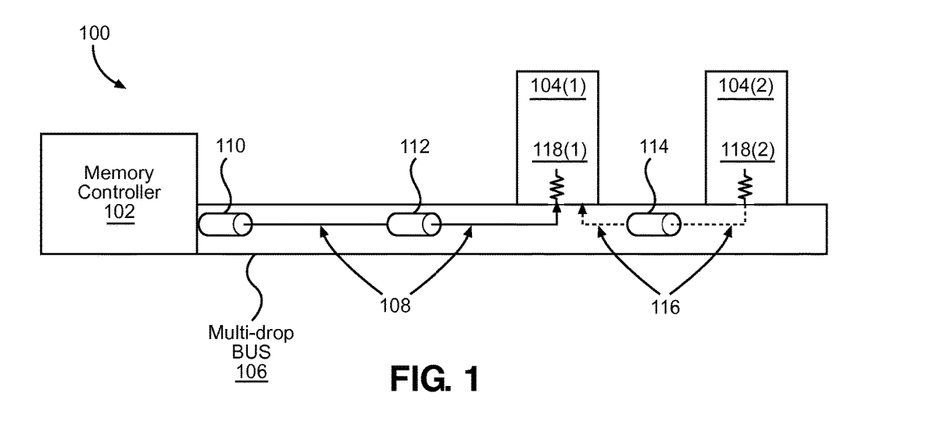
FIG. 1 is a schematic diagram of an exemplary multi-drop memory system that includes a pair of dual inline memory modules (DIMMs)

Before discussing aspects of a multi-drop memory system that includes specific aspects of the present disclosure, a brief overview of a multi-drop memory system that may incorporate exemplary aspects of the present disclosure is provided with reference to FIG. 1. The discussion of specific exemplary aspects of a multi-drop memory system that comprises a memory circuit begins with reference to FIG. 2.

In this regard, FIG. 1 illustrates an exemplary schematic diagram of a multi-drop memory system 100 that may benefit through inclusion of aspects of the present disclosure. The multi-drop memory system 100 comprises a memory controller 102 that connects to a pair of dual inline memory modules (DIMMs) 104(1), 104(2) over a multi-drop bus 106. In the absence of exemplary aspects of the present disclosure, when a high frequency data signal 108 propagates from the memory controller 102 towards the DIMMs 104(1), 104(2), the electrical characteristics of the high frequency data signal 108 may be significantly different at the DIMMs 104(1), 104(2) due to signal distortion and/or interference on the multi-drop bus 106. Taking the DIMM 104(1) as an example, the electrical characteristics of the high frequency data signal 108 are impacted by a first impedance 110 at the memory controller 102, a second impedance 112 at the multi-drop bus 106, and a third impedance 114, as well as by a reflection signal 116 in between the DIMMs 104(1), 104(2). The reflection signal 116 travels back towards the memory controller 102 and collides with the high frequency data signal 108 at the DIMM 104(1), creating an interference known as cross talk or inter-symbol interference (not shown).

With continuing reference to FIG. 1, to preserve signal integrity at the DIMMs 104(1), 104(2), on-die-terminations 118(1), 118(2) are employed at the DIMMs 104(1), 104(2), respectively, to provide proper impedance terminations. The latest Joint Electron Device Engineering Council (JEDEC) synchronous dynamic random access memory (SDRAM) standards, such as personal-computer (PC) double data rate (DDR)-3, low-power (LP) DDR-4 and PCDDR-4, have introduced dynamic on-die termination to provide customized impedance terminations on individual memory chips. Dynamic on-die termination also provides the memory controller 102 with increased flexibility to optimize impedance termination values individually for the DIMM 104(1) and the DIMM 104(2) on the multi-drop bus 106. With dynamic on-die termination, a different ODT value may be opportunistically applied to the DIMMs 104(1), 104(2), respectively, based on the electrical characteristics experienced at the DIMMs 104(1), 104(2). A plurality of ODT values (not shown) may be determined and stored at the memory controller 102 for each of the DIMMs 104(1), 104(2) during a calibration process known as link training. The link training process also determines and stores at the memory controller 102 an EQ setting (not shown) for the multi-drop memory system 100.

With continued reference to FIG. 1, in contrast to the plurality of ODT values that are determined respectively for each of the DIMMs 104(1), 104(2) in the multi-drop memory system 100, the EQ setting is static and applicable to all of the DIMMs 104(1), 104(2) in the multi-drop memory system 100 regardless of impedance variations along the multi-drop bus 106. Prior to accessing (e.g., reading data from or writing data to) the DIMM 104(1), the memory controller 102 configures the DIMM 104(1) with both a predetermined ODT value, which is chosen from the plurality of ODT values determined during calibration, and with the EQ setting so as to enable on-die impedance termination and data signal equalization at the DIMM 104(1). Equalization refers to a process, commonly employed at an electronic signal receiver, to restore frequency domain characteristics of an electronic signal that may have been distorted and/or attenuated by a transmission medium. In addition, equalization may also be used by the electronic signal receiver to compensate signal distortion resulting from improper equalization at an electronic signal transmitter, such as the memory controller 102. In this regard, the DIMM 104(1) configures on-die impedance termination based on the predetermined ODT value and equalizes the high frequency data signal 108 based on the EQ setting. Likewise, the memory controller 102 configures the DIMM 104(2) with another predetermined ODT value and the EQ setting prior to accessing the DIMM 104(2). In conventional systems, the EQ setting is only determined for the multi-drop memory system 100 as a whole, causing equalization effectiveness to be compromised, and signal integrity may be degraded at the DIMMs 104(1), 104(2). Aspects of the present disclosure expand the capabilities of the memory controller 102 to optimize signaling to individual DIMMs 104 on the multi-drop bus 106 to further reduce impedance mismatch and reduce reflection-induced interference.

Figure 2:
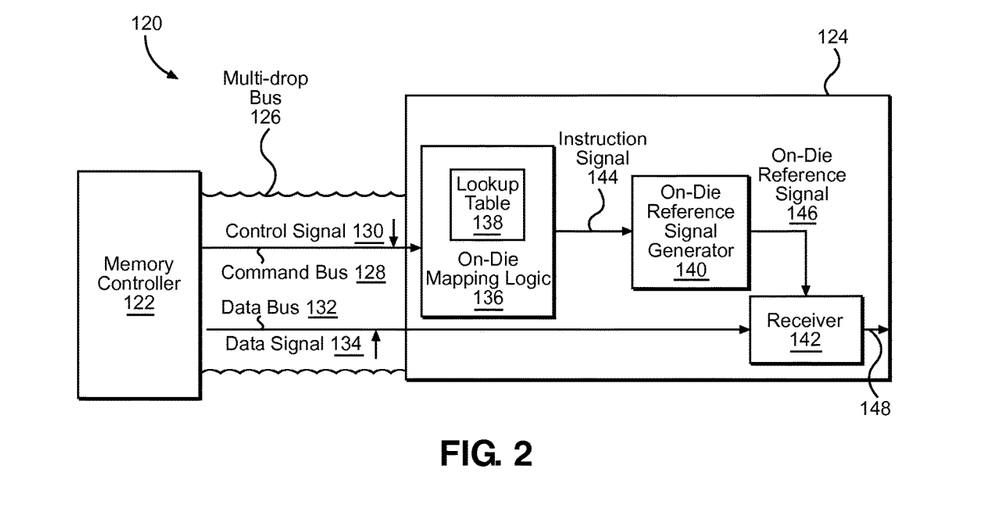
FIG. 2 is a schematic diagram illustrating an exemplary multi-drop memory system that comprises a memory controller and a memory circuit configured to dynamically adjust a reference signal based on a predetermined on-die termination (ODT) value to provide proper equalization on a received data signal.

In this regard, FIG. 2 illustrates an exemplary schematic diagram of a multi-drop memory system 120 that comprises a memory controller 122 and memory circuit 124 configured to dynamically adjust an on-die reference signal (e.g., $V_{REF}$) based on the predetermined ODT value to provide proper equalization on a received data signal. As described in FIG. 1 above, such signal distortion and/or attenuation are combined results of various impedances and/or interferences in the conventional multi-drop memory system 100 and imperfect signal equalization provided by the memory controller 102. Without proper equalization at the electronic signal receiver, a useful part of the electronic signal (e.g., a data carrying signal) may be overwhelmed by noise signals or so distorted so as to become undetectable by the electronic signal receiver. As a result, data transmission error increases, thus leading to reduced data transmission efficiency and throughput.

With reference to FIG. 2, the memory controller 122 connects to the memory circuit 124 via the multi-drop bus 126. The multi-drop bus 126 comprises a command bus 128, which is configured to carry a control signal 130, and a data bus 132, which is configured to carry a data signal 134. The memory circuit 124 comprises an on-die mapping logic 136, a lookup table 138, an on-die reference signal generator 140, and a receiver 142. Although the lookup table 138 is shown to be inside the on-die mapping logic 136, as a non-limiting example, the lookup table 138 can be implemented outside the on-die mapping logic 136 in the memory circuit 124 as well. The on-die mapping logic 136 is connected to the command bus 128 to receive the control signal 130 from the memory controller 122. The receiver 142 is connected to the data bus 132 to receive the data signal 134 from the memory controller 122.

Similar to the memory controller 102 in FIG. 1, the memory controller 122 in FIG. 2 also needs to configure the memory circuit 124 to provide on-die impedance termination and data signal equalization, among other configurations, prior to accessing (e.g., reading data from or writing data to) memory ranks (not shown) of the memory circuit 124. To do so, the memory controller 122 includes a predetermined ODT value and a predetermined EQ setting in the control signal 130 and transmits these values to the memory circuit 124 over the command bus 128. The predetermined ODT value and the predetermined EQ setting are transmitted to the memory circuit 124 in a single instruction step, thus reducing signaling overheads on the command bus 128. The predetermined ODT value and the predetermined EQ setting are determined, along with a plurality of other configuration parameters, during a calibration process also known as standard link training in JEDEC DDR standards. The calibration process will be described later in this disclosure in reference to FIGS. 4-5. During the calibration process, the memory circuit 124 creates and populates the lookup table 138 according to a data structure illustrated in FIG. 3, discussed below. Elements of FIG. 2 are referenced in connection with FIG. 3 and will not be re-described herein. Further discussion of FIG. 2 will follow discussion of FIG. 3.

Figure 3:
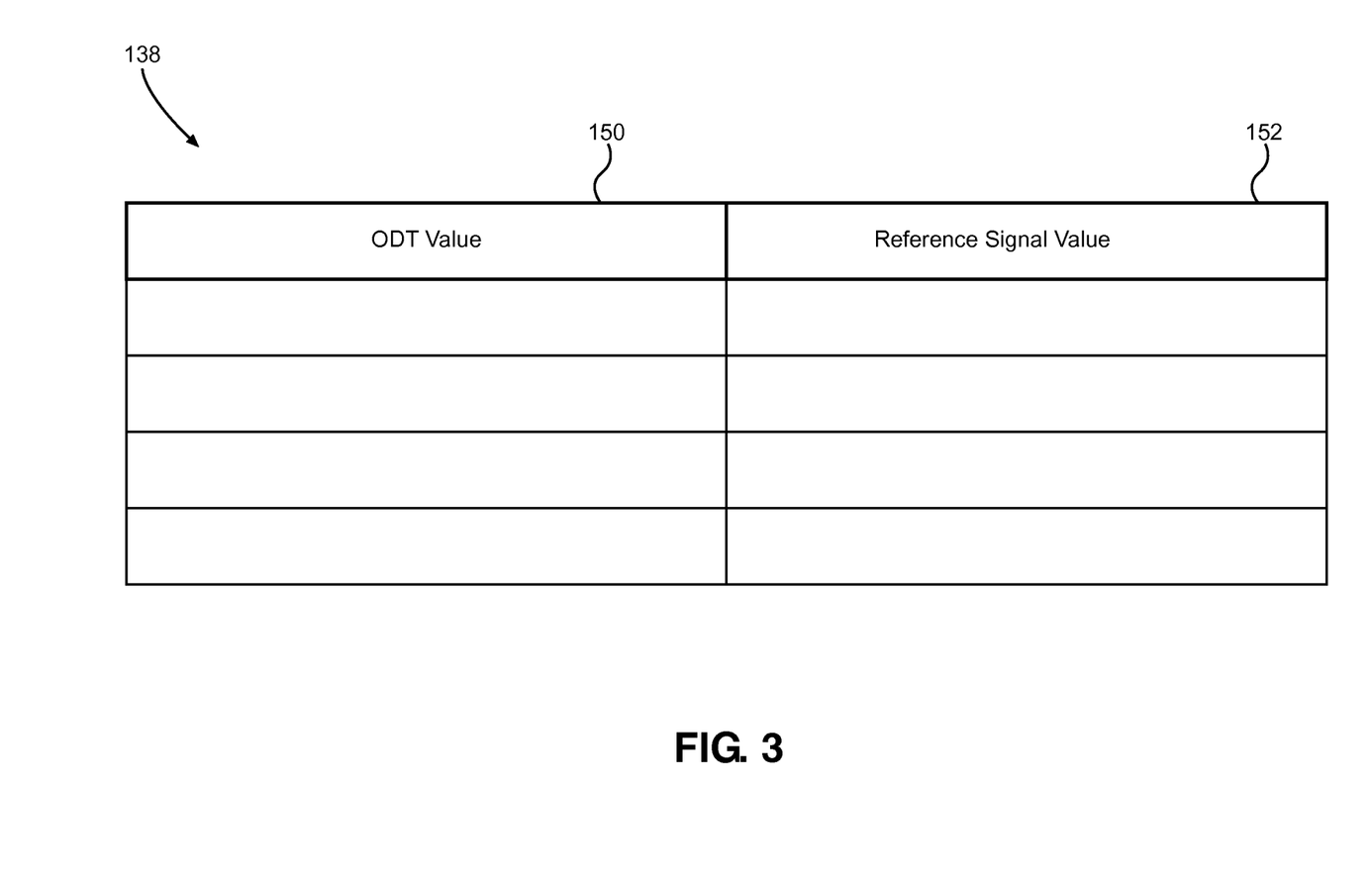
FIG. 3 is a data structure illustrating an exemplary lookup table configured to map a predetermined ODT value to a predetermined reference signal value.

FIG. 3 is an exemplary data structure illustrating the lookup table 138 configured to map the predetermined ODT value to a predetermined reference signal value. According to FIG. 3, the lookup table 138 comprises an ODT value column 150 that contains the predetermined ODT value and a reference signal value column 152 that contains the predetermined reference signal value. In this regard, the memory circuit 124 establishes correlations between a plurality of predetermined ODT values and a plurality of predetermined reference signal values in the lookup table 138.

With reference back to FIG. 2, the on-die mapping logic 136 receives the predetermined ODT value and the predetermined EQ setting via the control signal 130. The on-die mapping logic 136 is then configured to retrieve the predetermined reference signal value from the lookup table 138 based on the predetermined ODT value. The predetermined reference signal value is determined during calibration to compensate for inefficiency of the predetermined EQ setting, thus giving the memory circuit 124 the ability to provide proper per-drop equalization for the data signal 134. The on-die mapping logic 136 then transmits an instruction signal 144, which carries the predetermined reference signal value retrieved from the lookup table 138, to instruct the on-die reference signal generator 140 to produce an on-die reference signal 146 based on the predetermined reference signal value. In a non-limiting example, the on-die reference signal 146 is a voltage reference signal $V_{REF}$. The on-die reference signal 146 is received and used by the receiver 142 to provide per-drop equalization on the data signal 134 and produce an equalized complementary metal oxide semiconductor (CMOS) level signal output 148. In a non-limiting example, the memory controller 122 may equalize the data signal 134 based on the predetermined EQ setting before transmitting to the memory circuit 124. Because the predetermined EQ setting is determined for all drops in the multi-drop memory system 120, the data signal 134 may not be best suited to the memory circuit 124. With the ability to implement per-drop equalization by dynamically adjusting the on-die reference signal 146, the memory circuit 124 is able to compensate for impacts of imperfect memory controller 122 equalization on the data signal 134, thus preserving signal integrity and improving signal robustness.

Figure 4:
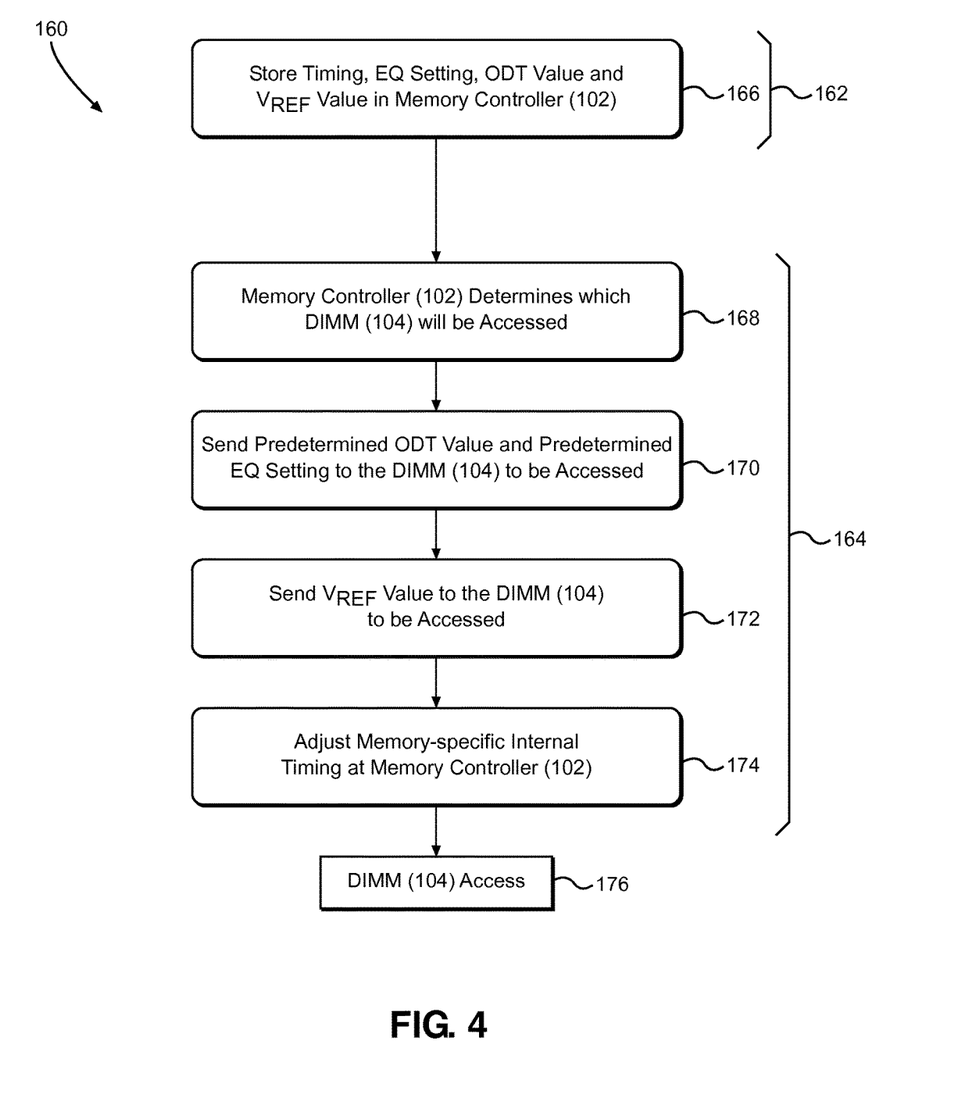
FIG. 4 is a flowchart illustrating a calibration and pre-access configuration process for calibrating and configuring the DIMMs in FIG. 1 for read and write operations.

FIG. 4 is an exemplary flowchart illustrating a calibration and pre-access configuration process 160 for calibrating and configuring the DIMMs 104(1), 104(2) in FIG. 1 prior to read and write operations. Elements of FIG. 1 are referenced in connection with FIG. 4 and will not be re-described herein. The calibration and pre-access configuration process 160 comprises a calibration sub-process 162 and a pre-access configuration sub-process 164. The memory controller 102 conducts the calibration sub-process 162 on each of the DIMMs 104(1), 104(2) in the multi-drop memory system 100. As a non-limiting example, the memory controller 102 may conduct the calibration sub-process 162 at start-up of the multi-drop memory system 100, based on predetermined calibration intervals, or in response to a predetermined triggering event (e.g., temperature and/or voltage change) in the DIMMs 104(1), 104(2). During the calibration sub-process 162, the memory controller 102 determines and stores a plurality of configuration parameters for the multi-drop memory system 100, including internal timing setting, EQ setting, ODT value, and $V_{REF}$ value among other configuration parameters (block 166). While the internal timing setting, ODT value, and $V_{REF}$ value are DIMM-dependent and specific to each of the DIMMs 104(1), 104(2), the EQ setting parameter is DIMM-independent and generic across the multi-drop memory system 100. As such, the EQ setting is generally a compromised parameter with regard to each of the DIMMs 104(1), 104(2) in the multi-drop memory system 100. That is, the EQ setting is not optimized for any particular DIMM 104, but is a best fit for all the DIMMs 104.

With continuing reference to FIG. 4, the memory controller 102 invokes the pre-access configuration sub-process 164 prior to accessing the DIMM 104(1) or the DIMM 104(2). Unlike the calibration sub-process 162, the pre-access configuration sub-process 164 is performed on a targeted DIMM 104 the memory controller 102 is preparing to read data from or write data to. In this regard, the memory controller 102 must first determine which of the DIMMs 104(1), 104(2) will be accessed next (block 168). The memory controller 102 then configures the targeted DIMM 104 by sending the predetermined ODT value and the predetermined EQ setting (block 170) and the $V_{REF}$ value (block 172) to the targeted DIMM 104. The targeted DIMM 104, in response to receiving the predetermined ODT value, the predetermined EQ setting, and the $V_{REF}$ value, performs internal configuration to provide on-die termination and equalization as instructed by the memory controller 102. In addition to configuring the targeted DIMM 104, the memory controller 102 adjusts memory-specific internal timing for the targeted DIMM 104 (block 174) and then starts read and/or write operation on the targeted DIMM 104 (block 176).

Figure 5:
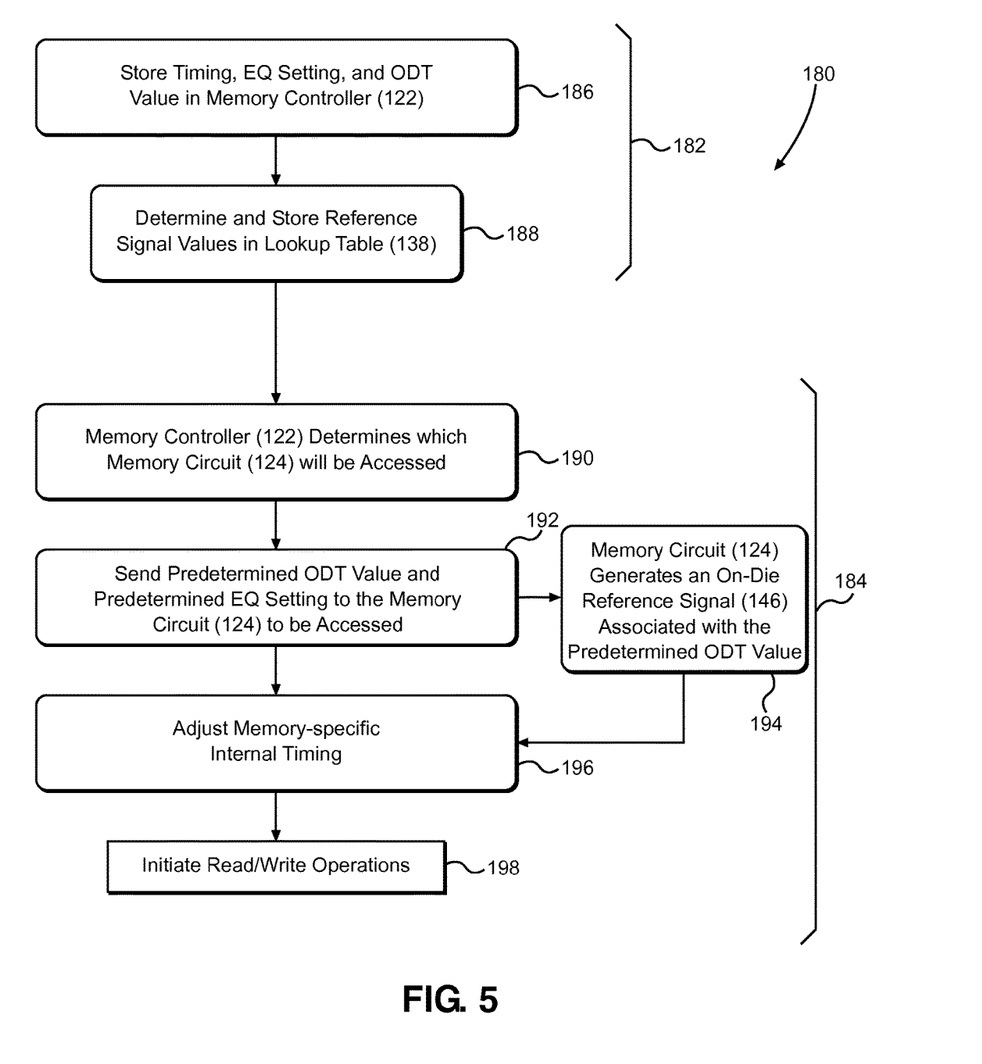
FIG. 5 is a flowchart illustrating an exemplary calibration and pre-access configuration process for calibrating and configuring the memory circuit in FIG. 2 for read and write operations.

Although the calibration and pre-access configuration process 160 is generally applicable to calibration and pre-access configuration of the multi-drop memory system 120 in FIG. 2, the process may be optimized for memory circuit 124. In this regard, FIG. 5 is a flowchart illustrating an exemplary calibration and pre-access configuration process 180 for calibrating and configuring the memory circuit 124 in FIG. 2 prior to read and write operations. Elements of FIG. 2 are referenced in connection with FIG. 5 and will not be re-described herein.

Similar to the calibration and pre-access configuration process 160 of FIG. 4, the calibration and pre-access configuration process 180 comprises a calibration sub-process 182 and a pre-access configuration sub-process 184. The memory controller 122 conducts the calibration sub-process 182 on the memory circuit 124 in the multi-drop memory system 120. As a non-limiting example, the memory controller 122 may conduct the calibration sub-process 182 at start-up of the multi-drop memory system 120, based on predetermined calibration intervals, or in response to a predetermined triggering event (e.g., temperature and/or voltage change) in the memory circuit 124. During the calibration sub-process 182, the memory controller 122 determines and stores a plurality of configuration parameters for the multi-drop memory system 120, including at least one internal timing, a generic EQ setting, and at least one ODT value among other configuration parameters (block 186). In contrast to the calibration sub-process 162 described in FIG. 4, the memory circuit 124 determines at least one reference signal value (e.g., $V_{REF}$ value) and stores the at least one reference signal value in the lookup table 138 in association with the at least one ODT value (block 188). The at least one reference signal value is determined by the memory circuit 124 to compensate for an equalization deficiency inherited in the generic EQ setting, thus preserving signal integrity and improving signal robustness at the memory circuit 124. Although the calibration activities performed by the memory controller 122 (block 186) and the calibration activities performed by the memory circuit 124 (block 188) are shown to be conducted in sequential order in the exemplary flowchart, it is possible for the memory controller 122 and the memory circuit 124 to perform their respective calibration activities in parallel.

With continuing reference to FIG. 5, the memory controller 122 invokes the pre-access configuration sub-process 184 prior to accessing the memory circuit 124. Unlike the calibration sub-process 182, the pre-access configuration sub-process 184 is performed on the memory circuit 124 that the memory controller 122 is preparing to read data from or write data to. In this regard, the memory controller 122 must first determine which memory circuit 124 in the multi-drop memory system 120 will be accessed next (block 190). The memory controller 122 then configures the memory circuit 124 by sending the predetermined ODT value and the predetermined EQ setting (block 192) to targeted memory circuit 124. The memory circuit 124 in turn retrieves the predetermined reference signal value from the lookup table 138 based on the predetermined ODT value and generates the on-die reference signal 146 according to the predetermined reference signal value (block 194). In addition to configuring the memory circuit 124, the memory controller 122 adjusts memory specific internal timing and a slew rate for the targeted memory circuit 124 (block 196) and then initiates read and/or write operations on the targeted memory circuit 124 (block 198).

Figure 6A:
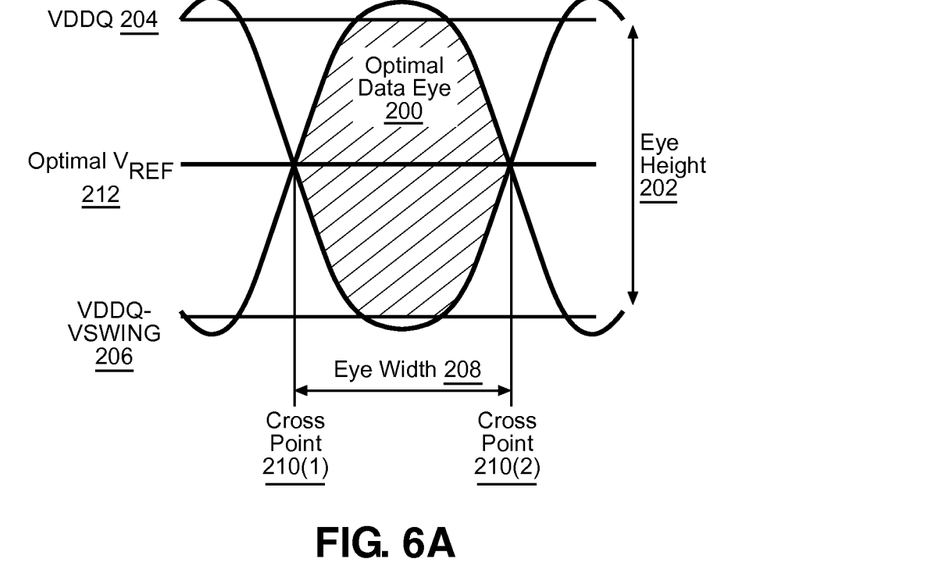
FIG. 6A is an exemplary plot graph illustrating an optimal data eye diagram when an optimal reference signal ($V_{REF}$) is provided to a predetermined equalization (EQ) setting at a DIMM.

As previously discussed in FIG. 2, with the ability to dynamically adjust the on-die reference signal 146, the memory circuit 124 is able to compensate for deficiencies associated with the predetermined EQ setting so as to preserve signal integrity and improve signal robustness. Such improvement in signal robustness can be visualized in a data eye diagram. A data eye diagram is a time-domain representation of the high frequency data signal from which electrical quality of high frequency data signal can be visualized and characterized. In this regard, FIG. 6A is an exemplary plot graph illustrating an optimal data eye diagram when an optimal reference signal ($V_{REF}$) is provided to a predetermined EQ setting at a DIMM. As shown in FIG. 6A, an optimal data eye 200 has an eye height 202 determined by a high voltage signal (VDDQ) 204 and a low voltage signal (VDDQ-VSWING) 206 in the vertical dimension. The optimal data eye 200 has an eye width 208 determined by a pair of cross points 210(1), 210(2). An optimal reference voltage signal ($V_{REF}$) 212 produces a 50% eye crossing, which is computed as ($V_{REF}$-VDDQ-VSWING)/(VDDQ-VDDQ-VSWING), and makes the optimal data eye 200 symmetric in both vertical and horizontal dimensions. A symmetric data eye indicates a high degree of integrity and robustness in the high frequency data signal received by the DIMM.

Figure 6B:
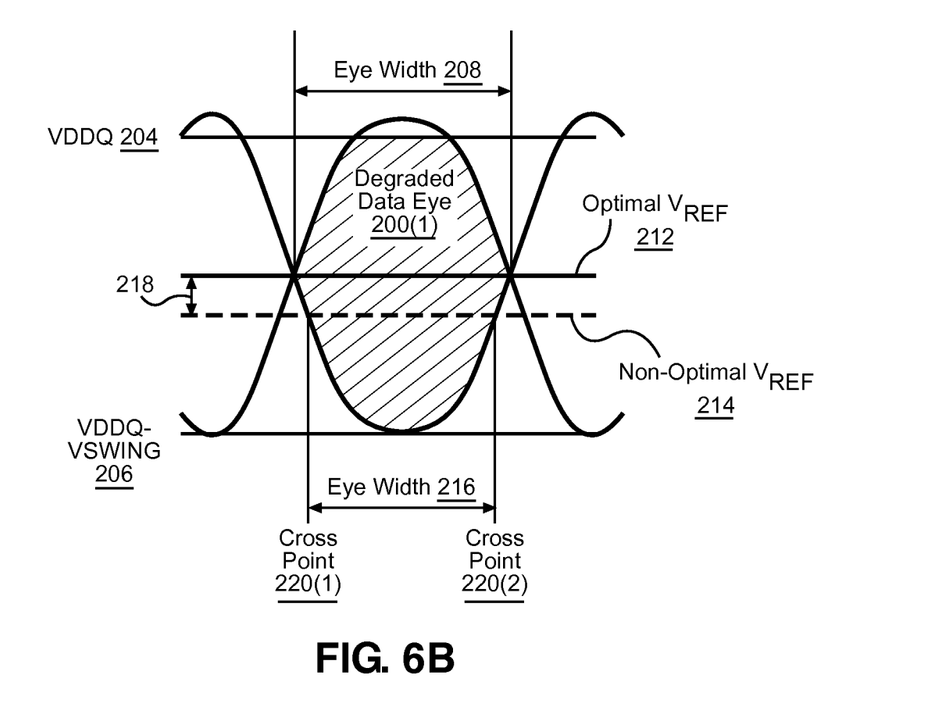
FIG. 6B is an exemplary plot graph illustrating how a dynamic on-die reference signal adjustment scheme employed in the memory circuit in FIG. 2 can aid in restoring a degraded data eye resulting from a non-optimal reference signal ($V_{REF}$)

FIG. 6B is an exemplary plot graph illustrating how a dynamic on-die reference signal adjustment scheme employed by the memory circuit 124 of FIG. 2 can help restore a degraded data eye 200(1) that results from a non-optimal reference signal ($V_{REF}$) 214 back to an optimal form. Elements of FIG. 2 are referenced in connection with FIG. 6B and will not be re-described herein. When equalization is turned on by the memory circuit 124 in FIG. 2, the swing level may be pulled toward the level of the VDDQ-VSWING 206, for example. When unattended, the optimal reference signal ($V_{REF}$) 212 will be shifted downward, and consequently becomes the non-optimal reference signal ($V_{REF}$) 214. When the non-optimal reference signal ($V_{REF}$) 214 is provided to the receiver 142 in the memory circuit 124 as illustrated in FIG. 6B, the non-optimal reference signal ($V_{REF}$) 214 produces a less than 50% eye crossing because the non-optimal reference signal ($V_{REF}$) 214 is lower than the optimal reference signal ($V_{REF}$) 212 by a voltage differential 218. The downward eye crossing shift results in a reduced eye width 216 that is defined by a new pair of cross points 220(1), 220(2). Consequently the data eye 200(1) loses symmetry and shrinks in size, indicating that the integrity and robustness of the data signal 134 have been compromised.

As previously described in FIG. 2, the on-die mapping logic 136 is configured to instruct the on-die reference signal generator 140 to produce the on-die reference signal 146 based on the corresponding reference signal value retrieved from the lookup table 138. In a non-limiting example, the on-die reference signal 146 is provided to the receiver 142 as the optimal reference signal ($V_{REF}$) 208, which acts to override the non-optimal reference signal ($V_{REF}$) 210 so as to restore symmetry of the degraded data eye 200(1). Thus, by dynamically replacing the non-optimal reference signal ($V_{REF}$) 210 with the optimal reference signal ($V_{REF}$) 208, integrity and robustness of the data signal 134 can be preserved.

The memory circuit configuration schemes on multi-drop buses according to aspects disclosed herein are not limited in the scope to memory systems. The circuit configuration schemes disclosed herein may be applied to any electrical circuit requiring per-drop customization on a multi-drop bus.

The memory circuit configuration schemes on multi-drop buses according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 7:
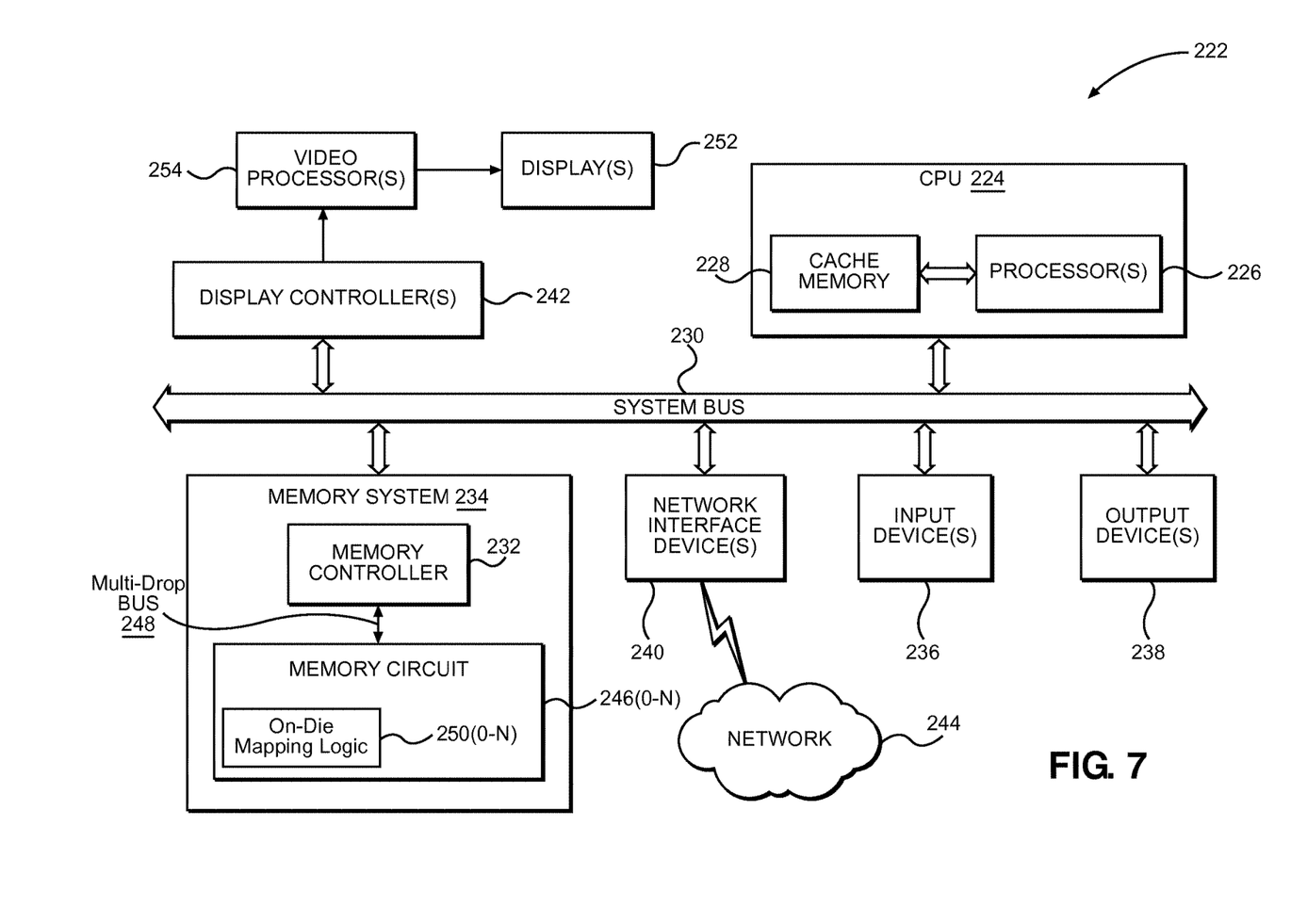
FIG. 7 is a block diagram of an exemplary processor-based system that can include the memory circuit of FIG. 2.

In this regard, FIG. 7 illustrates an example of a processor-based system 222 that can employ the multi-drop memory system 120 illustrated in FIG. 2. In this example, the processor-based system 222 includes one or more central processing units (CPUs) 224, each including one or more processors 226. The CPU(s) 224 may be a master device. The CPU(s) 224 may have cache memory 228 coupled to the processor(s) 226 for rapid access to temporarily stored data. The CPU(s) 224 is coupled to a system bus 230 and can intercouple master and slave devices included in the processor-based system 222. As is well known, the CPU(s) 224 communicates with these other devices by exchanging address, control, and data information over the system bus 230. For example, the CPU(s) 224 can communicate bus transaction requests to a memory controller 232 as an example of a slave device. Although not illustrated in FIG. 7, multiple system buses 230 could be provided, wherein each system bus 230 constitutes a different fabric.

Other master and slave devices can be connected to the system bus 230. As illustrated in FIG. 7, these devices can include a memory system 234, one or more input devices 236, one or more output devices 238, one or more network interface devices 240, and one or more display controllers 242, as examples. The input device(s) 236 can include any type of input device, including but not limited to input keys, switches, voice processors, etc. The output device(s) 238 can include any type of output device, including but not limited to audio, video, other visual indicators, etc. The network interface device(s) 240 can be any devices configured to allow exchange of data to and from a network 244. The network 244 can be any type of network, including but not limited to a wired or wireless network, a private or public network, a local area network (LAN), a wide local area network (WLAN), and the Internet. The network interface device(s) 240 can be configured to support any type of communications protocol desired. The memory system 234 can include one or more memory circuits 246(0-N) connected to the memory controller 232 via at least one multi-drop bus 248. The memory circuits 246(0-N) comprise an on-die mapping logic 250(0-N), respectively. In an exemplary embodiment, the memory controller 232 may be the memory controller 122 of FIG. 2. Likewise, the on-die mapping logic 250 may be the on-die mapping logic 136 of FIG. 2.

The CPU(s) 224 may also be configured to access the display controller(s) 242 over the system bus 230 to control information sent to one or more displays 252. The display controller(s) 242 sends information to the display(s) 252 to be displayed via one or more video processors 254, which process the information to be displayed into a format suitable for the display(s) 252. The display(s) 252 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A memory circuit comprising:
    an on-die reference signal generator;
    an on-die mapping logic separated from the on-die reference signal generator and configured to:
        receive an on-die termination (ODT) value on a first communication channel;
        retrieve a predetermined reference signal value based on the ODT value; and
        instruct the on-die reference signal generator to produce a predetermined reference signal associated with the predetermined reference signal value, wherein the predetermined reference signal is different from the predetermined reference signal value; and
    a receiver configured to equalize a data signal received on a second communication channel based on the predetermined reference signal.

2. The memory circuit of claim 1, wherein the first communication channel is a command bus of a multi-drop bus.

3. The memory circuit of claim 1, wherein the second communication channel is a data bus of a multi-drop bus.

4. The memory circuit of claim 1, further comprising a lookup table configured to map at least one ODT value to at least one predetermined reference signal value.

5. The memory circuit of claim 4, wherein the lookup table is included in the on-die mapping logic.

6. The memory circuit of claim 1, wherein the predetermined reference signal is a voltage reference signal ($V_{REF}$).

7. The memory circuit of claim 1, wherein the memory circuit is a dual inline memory module (DIMM).

8. The memory circuit of claim 1, wherein the memory circuit is a double data rate (DDR) synchronous dynamic random access memory (SDRAM) selected from the group consisting of: personal-computer (PC) DDR-3; low-power (LP) DDR-3; PCDDR-4; and LPDDR-4.

9. The memory circuit of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

10. A circuit comprising:
    an on-die reference signal generator;
    an on-die mapping logic separated from the on-die reference signal generator and configured to:
        receive an on-die termination (ODT) value on a first communication channel;
        retrieve a predetermined reference signal value based on the ODT value; and
        instruct the on-die reference signal generator to produce a predetermined reference signal associated with the ODT value, wherein the predetermined reference signal is different from the predetermined reference signal value; and
    a receiver configured to equalize a data signal received on a second communication channel based on the predetermined reference signal.

11. A method for configuring a calibrated memory circuit over a multi-drop bus prior to accessing the calibrated memory circuit, the method comprising:
    receiving an on-die termination (ODT) value by an on-die mapping logic in a calibrated memory circuit;
    retrieving a predetermined reference signal value from a lookup table based on the ODT value; and
    instructing an on-die reference signal generator separated from the on-die mapping logic to produce a predetermined reference signal based on the predetermined reference signal value, wherein the predetermined reference signal is different from the predetermined reference signal value.

12. The method of claim 11, further comprising applying the ODT value to provide on-die termination.

13. The method of claim 11, further comprising equalizing a data signal received over the multi-drop bus based on the predetermined reference signal received from the on-die reference signal generator.

14. A multi-drop memory system comprising:
a multi-drop bus comprising a command bus and a data bus;
a memory controller connecting to the multi-drop bus; and
at least one memory circuit connecting to the multi-drop bus, comprising:
an on-die mapping logic configured to:
receive a control signal from the memory controller over the command bus;
retrieve a predetermined reference signal value from a lookup table based on an on-die termination (ODT) value; and
generate an instruction signal including the predetermined reference signal value;
an on-die reference signal generator configured to receive the instruction signal and generate a predetermined reference signal associated with the predetermined reference signal value, wherein the predetermined reference signal is different from the predetermined reference signal value; and
a receiver configured to receive the predetermined reference signal and a data signal received from the memory controller over the data bus.

15. The multi-drop memory system of claim 14, wherein the memory controller is configured to initiate a calibration procedure by providing a calibration signal to the at least one memory circuit.

16. The multi-drop memory system of claim 15, wherein the memory controller is configured to initiate the calibration procedure at a start-up of the at least one memory circuit.

17. The multi-drop memory system of claim 15, wherein the memory controller is configured to initiate the calibration procedure in response to a predetermined triggering event.

18. The multi-drop memory system of claim 17, wherein the predetermined triggering event is a change in temperature or a change in voltage in the at least one memory circuit.

19. The multi-drop memory system of claim 15, wherein the memory controller is configured to initiate the calibration procedure based on predetermined calibration intervals.

20. The multi-drop memory system of claim 15, wherein the at least one memory circuit is configured to:
receive the calibration signal over the command bus;
create the lookup table containing an ODT value column and a reference signal value column;
receive at least one ODT value and an equalization (EQ) setting;
determine an optimal reference signal value based on the at least one ODT value and the EQ setting; and
store the at least one ODT value and the optimal reference signal value in the ODT value column and the reference signal value column of the lookup table, respectively.

21. The multi-drop memory system of claim 20, wherein the memory controller is further configured to send the ODT value and a predetermined EQ setting to the at least one memory circuit prior to accessing the at least one memory circuit.

22. The multi-drop memory system of claim 21, wherein the on-die reference signal generator is configured to generate the predetermined reference signal based on the predetermined reference signal value received from the on-die mapping logic.

23. The multi-drop memory system of claim 22, wherein the receiver is configured to equalize the data signal based on the predetermined reference signal.

24. The multi-drop memory system of claim 21, wherein the memory controller is configured to adjust internal timing to match the ODT value and the predetermined EQ setting.

25. The multi-drop memory system of claim 14, wherein the memory controller is configured to conduct a pre-transmission equalization on the data signal based on an equalization (EQ) setting determined for the multi-drop memory system.

26. The multi-drop memory system of claim 25, wherein the receiver is configured to conduct a per-drop equalization on the data signal based on the predetermined reference signal, wherein the predetermined reference signal is provided to compensate for deficiencies resulting from the pre-transmission equalization.

* * * * *